(12) United States Patent
Terasaki

(10) Patent No.: US 11,079,416 B2
(45) Date of Patent: Aug. 3, 2021

(54) VOLTAGE MONITORING APPARATUS

(71) Applicant: Rohm Co., Ltd., Kyoto (JP)

(72) Inventor: Fumihiko Terasaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/844,381

(22) Filed: Apr. 9, 2020

(65) Prior Publication Data

US 2020/0326359 A1 Oct. 15, 2020

(30) Foreign Application Priority Data

Apr. 11, 2019 (JP) .............................. JP2019-075666

(51) Int. Cl.
*H03K 5/08* (2006.01)
*G01R 19/165* (2006.01)

(52) U.S. Cl.
CPC . *G01R 19/16504* (2013.01); *G01R 19/16576* (2013.01); *H03K 5/084* (2013.01)

(58) Field of Classification Search
CPC ............ G01R 19/165; G01R 19/16504; G01R 19/16519; G01R 19/16566; G01R 19/16571; G01R 19/16576; H03K 5/08; H03K 5/082; H03K 5/084; H03K 5/15073; H02H 3/20; H02H 3/202; H02H 3/24; H02H 3/243
See application file for complete search history.

(56) References Cited

FOREIGN PATENT DOCUMENTS

JP 2018-117235 7/2018

*Primary Examiner* — Long Nguyen
(74) *Attorney, Agent, or Firm* — Fish & Richardson P.C.

(57) ABSTRACT

The present invention provides a voltage monitoring apparatus capable of stable operation even in a low-voltage region.

The voltage monitoring apparatus (1) includes: an inner voltage generating portion (40), lowering an input voltage (VIN) to generate an inner voltage (Vreg); an input voltage monitoring portion (30), receiving a power supply from an output terminal of the inner voltage generating portion (40) to operate; a switch portion (50), disposed between an input terminal of the input voltage (VIN) and the output terminal of the inner voltage generating portion (40); and a switch driving portion (60), turning on the switch portion (50) when the input voltage (VIN) is lower than a threshold voltage (for example, Vy<Vref), and turning off the switch portion (50) when the input voltage (VIN) is higher than the threshold voltage (for example, Vy>Vref). Furthermore, the threshold voltage is preferably set as, for example, turning off the switch portion (50) upon the inner voltage generating portion (40) changing to a state capable of outputting the inner voltage (Vreg) that is at least higher than a minimum operating voltage of the input voltage monitoring portion (30).

12 Claims, 7 Drawing Sheets

VOLTAGE MONITORING APPARATUS

BACKGROUND OF THE INVENTION

Field of the Invention

The present invention relates to a voltage monitoring apparatus.

Description of the Prior Art

A voltage monitoring apparatus (e.g., a reset IC (integrated circuit)) for monitoring whether an input voltage has reached a predetermined threshold is commonly utilized in various applications.

Further, refer to patent document 1 for an example of prior art related to the content above.

PRIOR ART DOCUMENTS

[Patent Publication]
[Patent document 1] Japan Patent Publication No. 2018-117235

SUMMARY OF THE INVENTION

Problems to be Solved by the Invention

However, there is still room for improvement in the stable operation in a low-voltage region for current voltage monitoring apparatuses (more particularly a high voltage tolerant device having a high maximum input voltage).

In view of the discussed issue discovered by the inventor of the application, an object of the invention disclosed by the present disclosure is to provide a voltage monitoring apparatus capable of stable operation even in a low-voltage region.

Technical Means for Solving the Problem

A voltage monitoring apparatus disclosed by the present disclosure is configured as below (first configuration), that is, including: an inner voltage generating portion, lowering an input voltage to generate an inner voltage; an input voltage monitoring portion, receiving a power supply from an output terminal of the inner voltage generating portion to operate: a switch portion, disposed between an input terminal of the input voltage and the output terminal of the inner voltage generating portion; and a switch driving portion, turning on the switch portion if the input voltage is lower than a threshold voltage, and turning off the switch portion if the input voltage is higher than the threshold voltage.

Further, a voltage monitoring apparatus including the first configuration is preferably configured as below (second configuration), that is, wherein the threshold voltage is set as: turning off the switch portion upon the inner voltage generating portion changing to a state capable of outputting the inner voltage at least higher than a minimum operating voltage of the input voltage monitoring portion.

Further, a voltage monitoring apparatus including the first or second configuration is preferably configured as below (third configuration), that is, wherein the threshold voltage is set as: turning off the switch portion before the input voltage exceeds a withstand voltage of the input voltage monitoring portion.

Further, a voltage monitoring apparatus including any one of the first to third configurations is preferably configured as below (fourth configuration), that is, wherein the switch portion includes a PMOSFET (p-channel metal-oxide-semiconductor field-effect transistor), having the source thereof connected to the input terminal of the input voltage and the drain thereof connected to the output terminal of the inner voltage generating portion; an NMOSFET (n-channel metal-oxide-semiconductor field-effect transistor), having the drain thereof connected to the gate of the PMOSFET, the source thereof connected to a ground terminal, and the gate thereof is connected to the switch driving portion; and a current source, having a first terminal thereof connected to the input terminal of the input voltage, and a second terminal thereof connected to the gate of the PMOSFET.

Further, a voltage monitoring apparatus including the fourth configuration is preferably configured as below (fifth configuration), that is, wherein the threshold voltage is set as: turning off the NMOSFET before the input voltage exceeds the gate-source withstand voltage of the PMOSFET.

Further, a voltage monitoring apparatus including anyone of the first to fifth configurations is preferably configured as below (sixth configuration), that is, wherein the input voltage monitoring portion includes: a first comparator, receiving the power supply from the output terminal of the inner voltage generating portion to operate, and comparing a first divided voltage corresponding to the input voltage with a predetermined reference voltage to generate a first comparison signal; and an output transistor, turning on/off according to the first comparison signal.

Further, a voltage monitoring apparatus including the sixth configuration is preferably configured as below (seventh configuration), that is, wherein the input voltage monitoring portion further includes a delay portion that provides the first comparison signal with a delay.

Further, a voltage monitoring apparatus including the sixth or seventh configuration is preferably configured as below (eighth configuration), that is, wherein the switch driving portion includes: a second comparator, receiving the power supply from the output terminal of the inner voltage generating portion to operate, and comparing a second divided voltage corresponding to the input voltage with the reference voltage to generate a second comparison signal for driving the switch portion.

Further, a voltage monitoring apparatus including the eighth configuration is preferably configured as below (ninth configuration), that is, further including: a divided voltage generating portion, dividing the input voltage to generate the first divided voltage and the second divided voltage.

Further, a voltage monitoring apparatus including the ninth configuration is preferably configured as below (tenth configuration), that is, wherein the divided voltage generating portion has a function of adjusting a voltage divider ratio of at least one of the first divided voltage and the second divided voltage.

Effects of the Invention

A voltage monitoring apparatus capable of stable operation even in a low-voltage region is provided according to the invention disclosed by the present disclosure.

DETAILED DESCRIPTION OF THE EMBODIMENTS

Voltage Monitoring Apparatus (Comparison Example)

Before the novel implementation of a voltage monitoring apparatus is described, comparison examples are first explained in brief.

Figure 1:
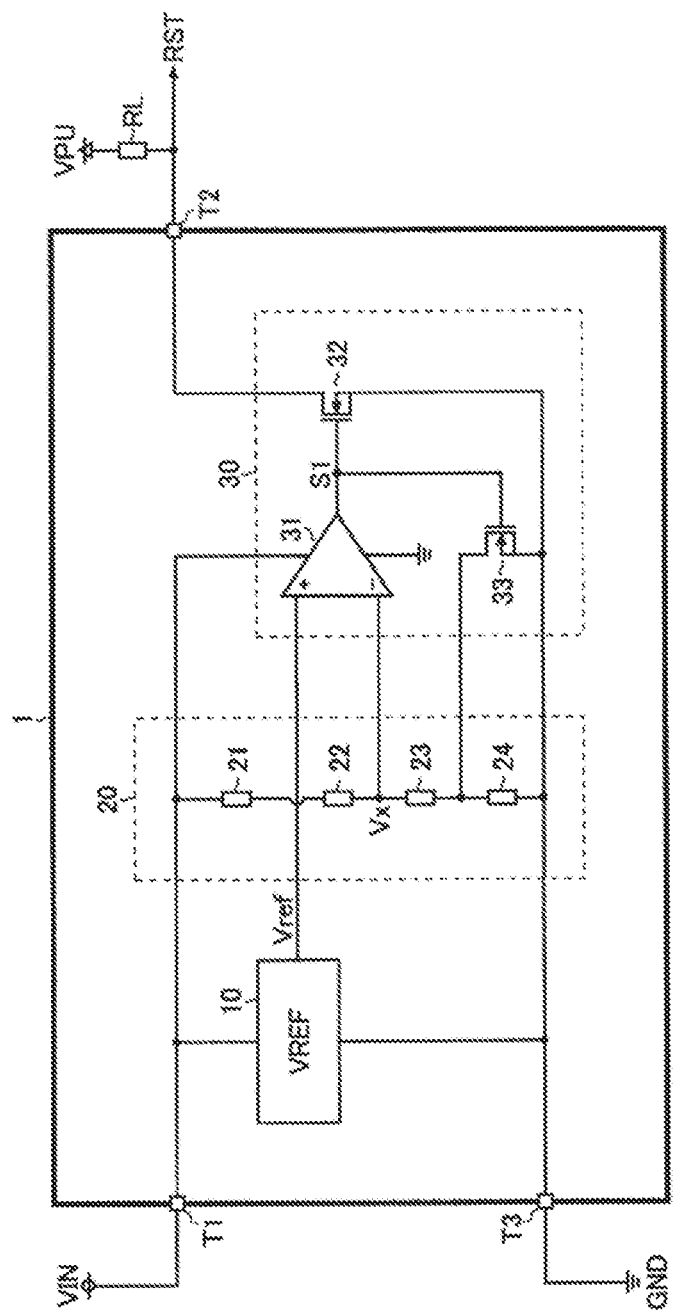
FIG. 1 is a diagram of a first comparison example of a voltage monitoring apparatus.

FIG. 1 shows a diagram of a first comparison example of a voltage monitoring apparatus. In the first comparison example, a voltage monitoring apparatus 1 is a semiconductor integrated circuit apparatus (a so-called reset IC), which monitors whether an input voltage VIN (e.g., a maximum value of 7 V) is currently rising and outputs a reset signal RST, and includes a reference voltage generating portion 10, a divided voltage generating portion 20 and an input voltage monitoring portion 30.

The voltage monitoring apparatus 1 further includes external terminals T1 to T3 as mechanisms for establishing electrical connection to the outside of the apparatus. The external terminal T1 is a power terminal receiving the input voltage VIN. The external terminal T2 is an output terminal for outputting the reset signal RST, and is connected to an application terminal of a boost voltage VPU through an externally installed resistor RL. The external terminal T3 is a ground terminal connected to a ground terminal.

The voltage monitoring apparatus 1 may further include constituting components or external terminals other than those described above. Further, in the voltage monitoring apparatus 1, various parasitic devices (e.g., parasitic diodes) are attached to the components; however, to keep the drawings simple, these parasitic devices are omitted from the drawings.

The reference voltage generating portion 10 is connected between the external terminal T1 and the external terminal T3, and generates a predetermined reference voltage Vref according to the input voltage VIN. Furthermore, a band-gap power supply having a small power supply dependency or a low temperature dependency is preferably used for the reference voltage generating portion 10.

The divided voltage generating portion 20 includes a resistance ladder (four resistors 21 to 24 are depicted as an example in this drawing) connected in series between the external terminal T1 and the external terminal T3, and divides the input voltage VIN by a predetermined voltage divider ratio α (where 0<α<1) to generate a divided voltage Vx (=α×VIN) corresponding to the input voltage VIN.

Furthermore, in this drawing, the divided voltage Vx is led out from a connecting node between the resistors 22 and 23; however, the lead-out point of the divided voltage Vx may be any as desired. Moreover, the respective resistance values of the resistors 21 to 24 may be slightly adjusted by trimming. As such, more ideally, the divided voltage generating portion 20 has a function of being capable of adjusting the voltage divider ratio α of the divided voltage Vx as desired.

The input voltage monitoring portion 30 is a circuit block that receives the power supply of the input voltage VIN from the external voltage T1 to operate accordingly, and includes a comparator 31 (equivalent to a first comparator) and NMOSFETs 32 and 33.

The comparator 31 compares the reference voltage Vref inputted to the non-inverting input terminal (+) with the divided voltage Vx inputted to the inverting input terminal (−) to generate a comparison signal S1. Furthermore, an upper-side power terminal of the comparator 31 is connected to an application terminal (i.e., the external terminal T1) of the input voltage VIN, and a lower-side power terminal of the comparator 31 is connected to an application terminal (i.e., the external terminal T3) of a ground voltage GND. Thus, the comparison signal S1 changes to a high level (=VIN) if Vx<Vref (and hence VIN<Vref/α), and changes to a low level (≈GND) if Vx>Vref (and hence VIN>Vref/α).

The NMOSFET 32 is an output transistor that is turned on/off according to the comparison signal S1, and forms an open-drain output stage for outputting the reset signal RST. To describe the connection relationship, the drain of the NMOSFET 32 is connected to the external terminal T2, the source of the NMOSFET 32 is connected to the external terminal T3, and the gate of the NMOSFET 32 is connected to the application terminal of the comparison signal S1.

The NMOSFET 32 is turned on if the comparison signal S1 is at a high level (≈VIN), and so the reset signal RST becomes low level (≈GND). On the other hand, the NMOSFET 32 is turned off if the comparison signal S1 is at a low level (≈GND), and so the reset signal RST becomes high level (≈VPU).

The NMOSFET 33 is a hysteresis providing transistor that is turned on/off according to the comparison signal S1. To describe the connection relationship, the drain of the NMOSFET 33 is connected to a connecting node between the resistors 23 and 24, the source of the NMOSFET 33 is connected to the external terminal T3, and the gate of the NMOSFET 33 is connected to the application terminal of the comparison signal S1.

If the comparison signal S1 is at a high level (≈VIN), the NMOSFET 33 is turned on and two terminals of the resistor 24 are short circuit, and so the voltage divider ratio α of the divided voltage Vx is decreased. On the other hand, if the comparison signal S1 is at a low level (≈GND), the NMOSFET 33 is turned off and two terminals of the resistor 24 are open circuit, and so the voltage divider ratio α of the divided voltage Vx is increased.

By switching control of the voltage divider ratio α above, a predetermined hysteresis voltage Vhys is provided between a reset release voltage (equivalent to the reset signal RST rising from a low level to the upper-side threshold voltage at a high level) and a reset detection voltage (equivalent to the reset signal RST lowering from a high level to the lower-side threshold voltage at a low level) of the input voltage VIN.

Furthermore, the voltage monitoring apparatus 1 in the first comparison example monitors a low voltage tolerant device having a low input voltage VIN (e.g., with a maximum of 7 V). Thus, even if the reference voltage generating portion 10 and the input voltage monitoring portion 30 include a low voltage tolerant device (e.g., a 7-V tolerant device), the input voltage VIN may be directly inputted as the respective power voltages.

Therefore, given that the input voltage VIN exceeds the minimum operating voltage VL (i.e., the higher one between the respective minimum operating voltages) of the reference voltage generating portion 10 and the input voltage monitoring portion 30, the voltage monitoring apparatus 1 in the first comparison example is capable of reliably lowering the reset signal RST in advance to a low level.

Figure 2:
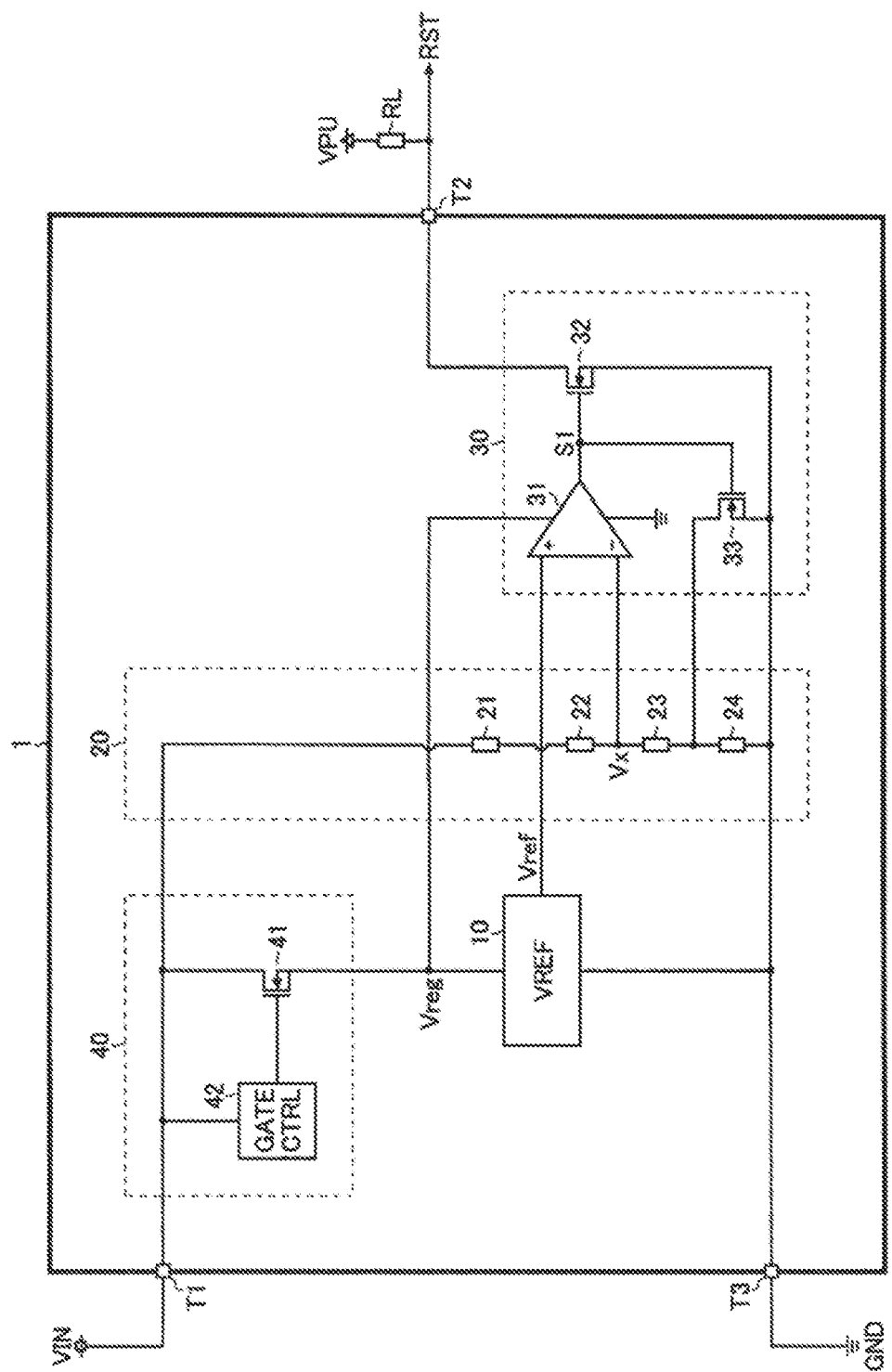
FIG. 2 is a diagram of a second comparison example of a voltage monitoring apparatus.

FIG. 2 shows a diagram of a second comparison example of a voltage monitoring apparatus. The voltage monitoring apparatus 1 in the second comparison example is theoretically a high voltage tolerant device that is able to receive an input of the input voltage VIN (e.g., a maximum of 60 V) higher than that of the first comparison example (FIG. 1), and further includes an inner voltage generating portion 40.

The inner voltage generating portion 40 is a linear regulator, such as LDO (low drop-out) regulator that lowers the input voltage VIN to generate an inner voltage Vreg (e.g., 5 V), and includes an NMOSFET 41 and a gate controller 42.

The drain of the NMOSFET 41 is connected to the external terminal T1 (i.e., the input terminal of the input voltage VIN), the source of the NMOSFET 41 serves as an output terminal of the inner voltage Vreg and is connected to the reference voltage generating portion 10 and the input voltage monitoring portion 30 (particularly the upper-side power terminal of the comparator 31), and the gate of the NMOSFET 41 is connected to the gate controller 42.

The gate controller 42 receives a power supply of the input voltage VIN from the external terminal T1 to operate, and performs gate controls of the NMOSFET 41 so as to coincide the inner voltage Vreg with an expected target value. More specifically, if the inner voltage Vreg is lower than the target value, the gate voltage of the NMOSFET 41 is increased and the on resistance value of the NMOSFET 41 is reduced, such that the inner voltage Vreg rises. Conversely, if the inner voltage Vreg is higher than the target value, the gate voltage of the NMOSFET 41 is reduced and the on resistance value of the NMOSFET 41 is increased, such that the inner voltage Vreg drops.

As such, the reference voltage generating portion 10 and the input voltage monitoring portion 30 receive, instead of the direct input of the input voltage VIN as the respective power voltages, the input of the even lower inner voltage Vreg as the respective power voltages to operate. Thus, even if the input voltage VIN is high, the reference voltage generating portion 10 and the input voltage monitoring portion 30 may include low voltage tolerant devices (e.g., 5-V tolerant devices).

However, with the inner voltage generating portion 40 introduced, the minimum operating voltage of the voltage monitoring apparatus 1 is increased. This issue is discussed in detail with the accompanying drawings below.

Figure 3:
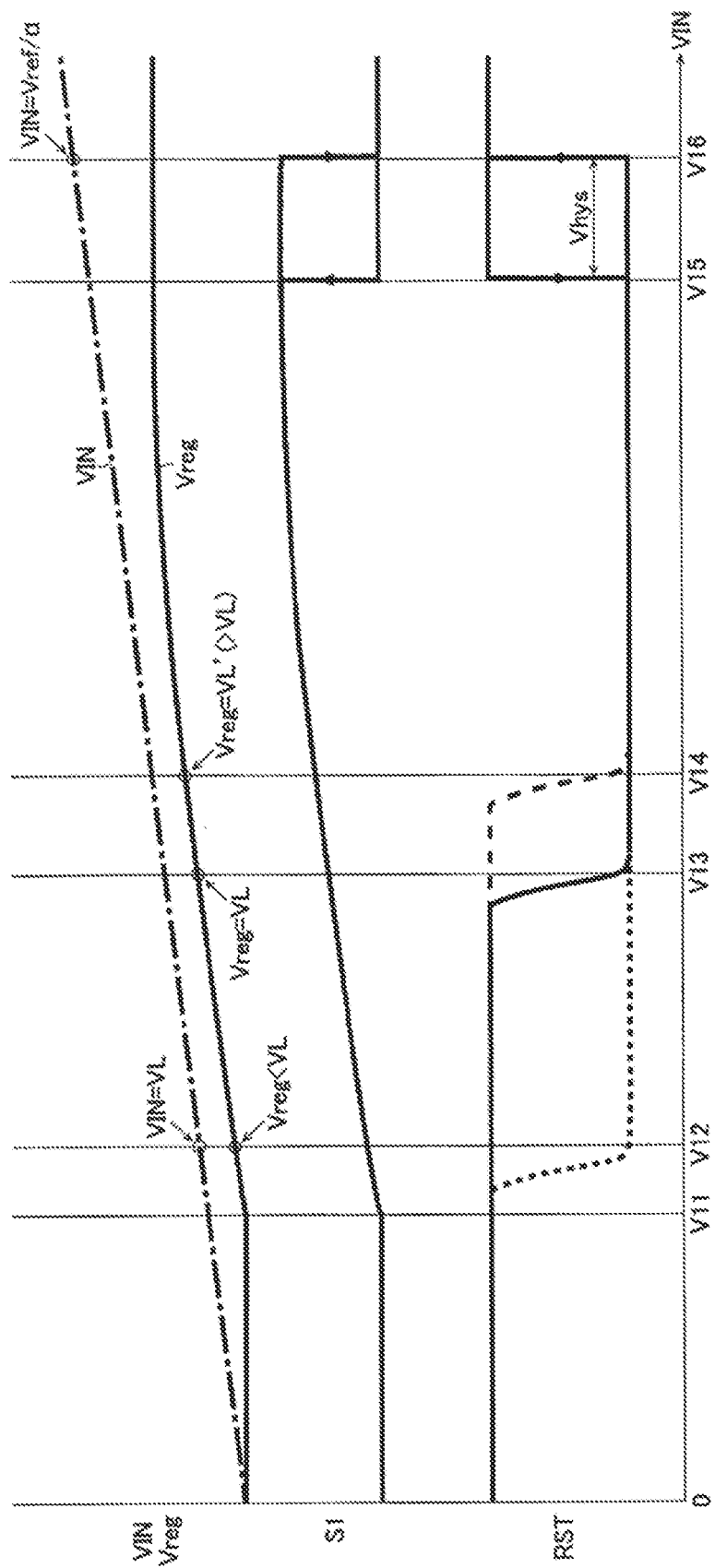
FIG. 3 is a diagram illustrating input/output characteristics of the second comparison example.

FIG. 3 shows a diagram illustrating input/output characteristics of the second comparison example. In an order from top to bottom, the input voltage VIN (dash-dotted line), the inner voltage Vreg (solid line), the comparison signal S1 and the reset signal RST are depicted. Furthermore, the horizontal axis of this diagram represents the input voltage VIN (herein, 0<V11<V12<V13<V14<V15<V16).

When 0<VIN<V11, the inner voltage generating portion 40 is not activated and a state of Vreg=0 V is maintained. Thus, both the reference voltage generating portion 10 ant the input voltage monitoring portion 30 change to indefinite states. However, as the external terminal T2 is connected to the application terminal of the boost voltage VPU through the externally installed resistor RL, the reset signal RST becomes high level (≈VPU).

When VIN>V11, the inner voltage generating portion 40 is activated, so the inner voltage Vreg starts rising toward a target value (e.g., 5 V). At that time point, the input voltage VIN has not yet reached the reset release voltage (=Vref/a), and so the comparison signal S1 becomes high level (≈Vreg). Thus, as the inner voltage Vreg rises, the high level of the comparison signal S1 also rises.

When VIN=V12, the input voltage VIN has reached the minimum operating voltage VL of the reference voltage generating portion 10 and the input voltage monitoring portion 30. Thus, for example, if the input voltage VIN is directly inputted as the respective power voltages of the reference voltage generating portion 10 and the input voltage monitoring portion 30, as in the first comparison example (FIG. 1), the reset signal RST may be lowered to a low level (referring to the dotted line of RST) at that time point.

However, in the voltage monitoring apparatus 1 of the second comparison example, the inner voltage Vreg lower than the input voltage VIN is inputted as the respective power voltages of the reference voltage generating portion 10 and the input voltage monitoring portion 30. Furthermore, at a time point at which VIN=V12 (=VL), Vreg<VL. Thus, both the reference voltage generating portion 10 and the input voltage monitoring portion 30 are kept at indefinite states, and the reset signal RST is kept at a state of having been increased to a high level (referring to the solid line of RST).

When VIN=V13, the inner voltage Vreg has reached the minimum operating voltage VL of the reference voltage generating portion 10 and the input voltage monitoring portion 30. Thus, the voltage monitoring apparatus 1 in the second comparison example is able to lower the reset signal RST to a low level (referring to the solid line of RST) only at that time point.

That is, with the inner voltage generating portion 40 introduced, the minimum operating voltage (equivalent to the input voltage VIN for reliably lowering the reset signal RST in advance to a low level) of the voltage monitoring apparatus 1 rises from the voltage value V12 to the voltage value V13. Furthermore, the difference between the two voltage values (=V13-V12) is equivalent to the amount of voltage drop in the inner voltage generating portion 40 (particularly the NMOSFET 41).

Furthermore, for example, if the input voltage VIN is applied as the boost voltage VPU, it is necessary that the NMOSFET 32 be able to withstand a high voltage (e.g., 60-V tolerant). In this case, the turn-on threshold voltage Vth of the NMOSFET 32 rises, in a way that the minimum operating voltage VL of the input voltage monitoring portion 30 is increased (VL→VL').

As a result, the input voltage VIN required for the inner voltage Vreg reaching the minimum operating voltage VL' of the input voltage monitoring portion 30 further increases. In this drawing, at a time point of VIN=V14, the inner voltage Vreg has reached the minimum operating voltage VL' of the input voltage monitoring portion 30. That is, by designing the NMOSFET 32 to have a high voltage tolerance, the minimum operating voltage of the voltage monitoring apparatus 1 further rises from the voltage value V13 to the voltage value V14 (referring to the long dashed line of RST).

Furthermore, if the input voltage VIN further rises, when VIN=V16, the comparison signal S1 lowers from a high level (≈Vreg) to a low level (≈GND). As a result, the reset signal RST rises from a low level (≈GND) to a high level (≈VPU).

On the other hand, if the input voltage VIN drops after the reset signal RST rises to a high level (≈VPU), when VIN=V15, the comparison signal S1 rises from a low level (≈GND) to a high level (≈Vreg). As a result, the reset signal RST drops from a high level (≈VPU) to a low level (≈GND).

That is, the voltage values V15 and V16 are respectively equivalent to the reset detection voltage and the reset release voltage of the input voltage VIN, with a hysteresis voltage Vhys being provided between the two.

Details of novel implementations for reducing a minimum operating voltage of a voltage monitoring apparatus to which a high input voltage VIN may be inputted (=a high voltage tolerant device required for the inner voltage generating portion 40 introduced) are given below.

Voltage Monitoring Apparatus (First Embodiment)

Figure 4:
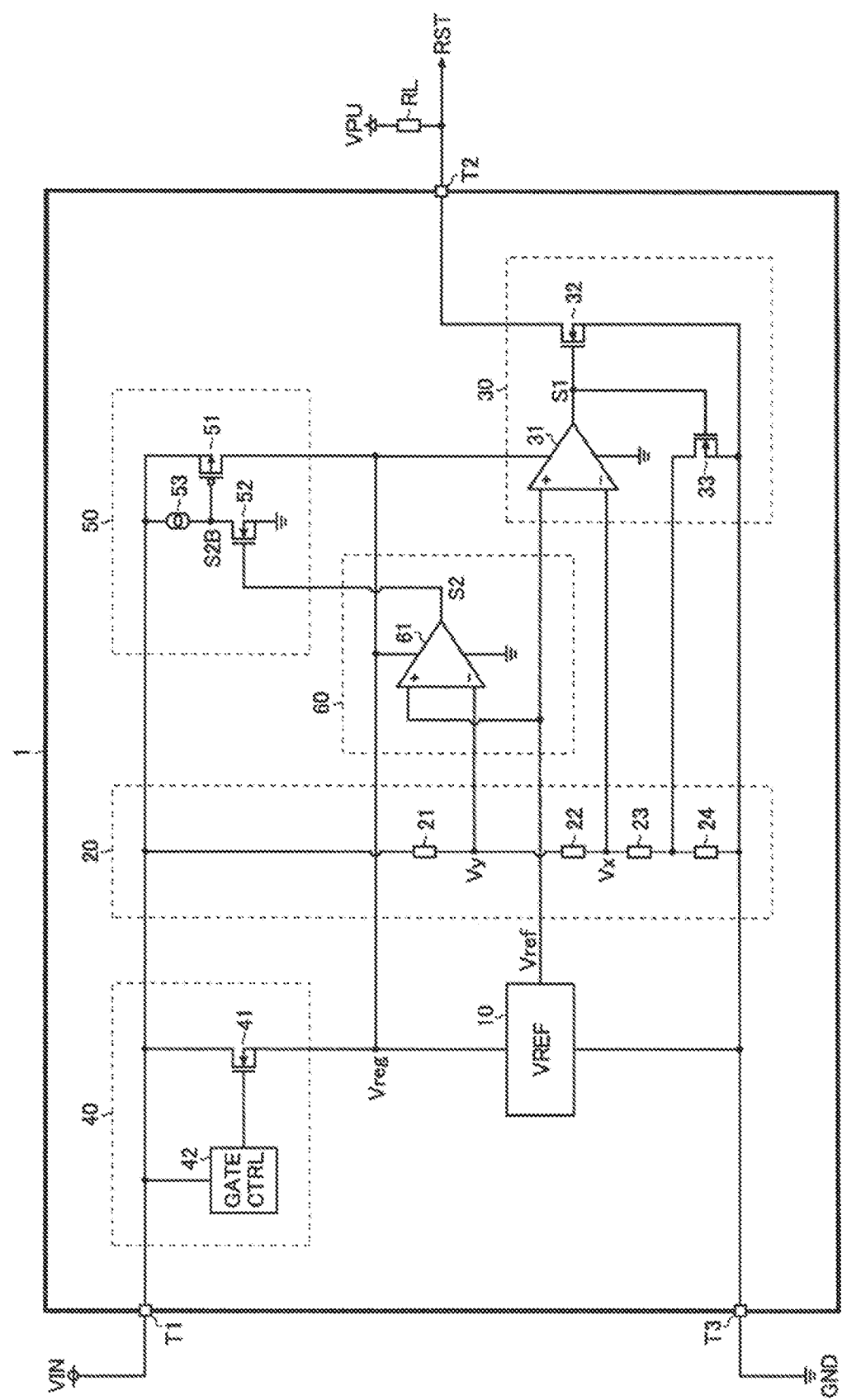
FIG. 4 is a diagram of a voltage monitoring apparatus according to a first embodiment.

FIG. 4 shows a diagram of a voltage monitoring apparatus according to a first embodiment of the present invention. The voltage monitoring apparatus 1 of the first embodiment is based on the second comparison example (FIG. 2) in the description above, and further includes a switch portion 50 and a switch driving portion 60.

The switch portion 50 is a circuit block disposed between an input terminal (equivalent to the external terminal T1) of the input terminal VIN (e.g., a maximum of 60 V or more) and an output terminal (=an output terminal of the inner voltage Vreg) of the inner voltage generating portion 40, and includes a PMOSFET 51, an NMOSFET 52 and a current source 53. These circuit components 51 to 53 are formed by high voltage tolerant devices (e.g., 60-V tolerant) capable of withstanding the application of the input voltage VIN.

The source of the PMOSFET 51 is connected to the input terminal (equivalent to the external terminal T1) of the input voltage VIN, and the drain of the PMOSFET 51 is connected to the output terminal (=the output terminal of the inner voltage Vreg) of the inner voltage generating portion 40. Furthermore, a current limiting resistor may also be placed between the source of the PMOSFET 51 and the input terminal of the input voltage VIN.

The drain of the NMOSFET 52 is connected to the gate of the PMOSFET 51, the source of the NMOSFET 52 is connected to a ground terminal (equivalent to the external terminal T3), and the gate of the NMOSFET 52 is connected to an output terminal (equivalent to an output terminal of a comparison signal S2 below) of the switch driving portion 60. Thus, the NMOSFET 52 is turned on if the comparison signal S2 is at a high level (≈Vreg or VIN), and is turned off if the comparison signal S2 is at a low level (≈GND).

A first terminal of the current source 53 is connected to the input terminal of the input voltage VIN, and a second terminal of the current source 53 is connected to the gate of the PMOSFET 51. Furthermore, the current source 53 may also be replaced by a load such as a resistor.

According to the connection above, the NMOSFET 52 and the current source 53 function as an inverter below, that is, inverting the logic level of the comparison signal S2 to generate and output an inverted comparison signal S2B to the gate of the PMOSFET 51.

Thus, if the comparison signal S2 is at a high level (≈Vreg or VIN), the inverted comparison signal S2B becomes low level (≈GND); conversely, if the comparison signal S2 is at a low level (≈GND), the inverted comparison signal S2B becomes high level (≈VIN).

Furthermore, if the inverted comparison signal S2B is at a low level (≈GND), the PMOSFET 51 is turned on, and Vreg is equal to VIN. On the other hand, if the inverted comparison signal S2B is at a high level (≈VIN), the PMOSFET 51 is turned off, and Vreg is not equal to VIN.

The switch driving portion 60 is a circuit block that turns on the switch portion 50 if the input voltage VIN is lower than a threshold voltage, and turns off the switch portion 50 if the input voltage VIN is higher than the threshold voltage, and includes a comparator 61 (equivalent to a second comparator).

The comparator 61 compares the reference voltage Vref inputted to the non-inverting input terminal (+) thereof with a divided voltage Vy(>Vx) inputted to the inverting input terminal (−) thereof to generate a comparison signal S2. Furthermore, similar to the divided voltage Vx, the divided voltage Vy is generated by the divided voltage generating portion 20.

More specifically, the divided voltage generating portion 20 divides the input voltage VIN by predetermined voltage divider ratios α and β (where 0<α<β<1) to generate divided voltages Vx (=α×VIN) and Vy (=β×VIN) corresponding to the input voltage VIN. As such, no additional circuit is required if the divided voltages Vx and Vy are generated by using the common divided voltage generating portion 20.

In this drawing, the divided voltage Vx is led out from a connecting node between the resistors 22 and 23, and the divided voltage Vy is led out from a connecting node between the resistors 21 and 22; however, the lead-out points of the divided voltages Vx and Vy may be any as desired. Furthermore, the respective resistance values of the resistors 21 to 24 may be slightly adjusted by trimming. As such, more ideally, the divided voltage generating portion 20 has a function of being capable of adjusting the respective voltage divider ratios α and β of the divided voltages Vx and Vy as desired.

Herein, an upper-side power terminal of the comparator 61 is connected to the output terminal of the inner voltage generating portion 40, and a lower-side power terminal of the comparator 61 is connected to an application terminal (equivalent to the external terminal T3) of the ground voltage GND. Thus, the comparison signal S2 becomes high level (≈Vreg or VIN) if Vy<Vref (and hence VIN<Vref/β), and becomes low level (≈GND) if Vy>Vref (and hence VIN>Vref/β).

Furthermore, similar to the reference voltage generating portion 10 or the input voltage monitoring portion 30, the comparator 61 may include a low voltage tolerant device (e.g., a 5-V tolerant device).

The voltage monitoring apparatus 1 of this embodiment is capable of lowering the minimum operating voltage by the switch portion 50 and the switch driving portion 60 introduced, wherein the minimum operating voltage is for reliably lowering the reset signal RST in advance to a low level. Details of such characteristic above are given with the accompanying drawings below.

Figure 5:
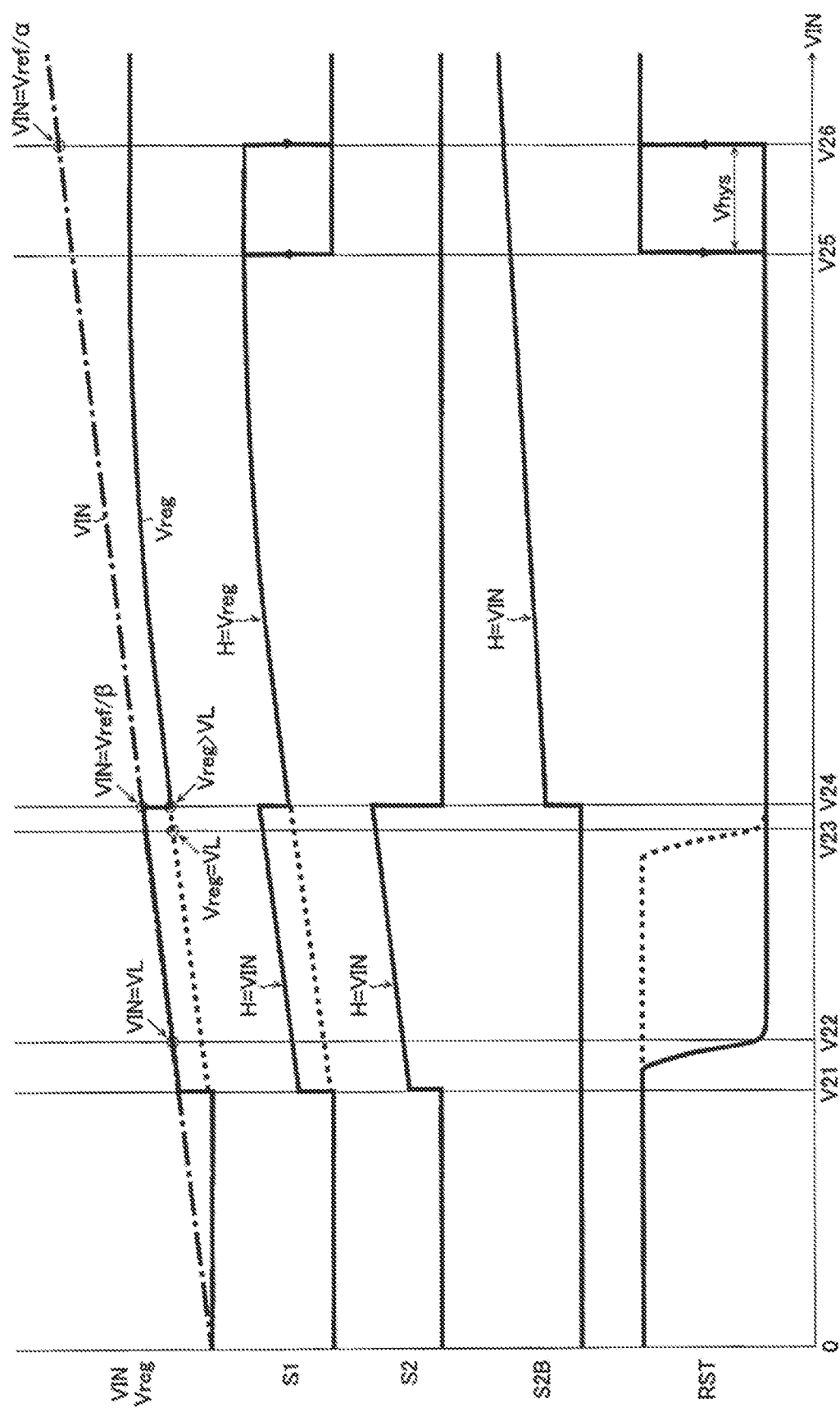
FIG. 5 is a diagram illustrating input/output characteristics according to the first embodiment.

FIG. 5 shows a diagram illustrating input/output characteristics of the first embodiment. In an order from top to bottom, the input voltage VIN (dash-dotted line), the inner voltage Vreg (solid line), the comparison signal S1, the comparison signal S2, the inverted comparison signal S2B and the reset signal RST are depicted. Furthermore, in regard to the inner voltage Vreg and the comparison signal S1, behaviors of the second comparison example (FIG. 3) are indicated by dotted lines. Furthermore, the horizontal axis of this drawing represents the input voltage VIN (herein, 0<V21<V22<V23<V24<V25<V26).

When 0<VIN<V21, the inner voltage generating portion 40 is not activated, and a state of Vreg=0 V is maintained. Thus, the reference voltage generating portion 10, the input voltage monitoring portion 30 and the switch driving portion 60 are all kept at indefinite states. However, the external terminal T2 is connected to the application terminal of the boost voltage VPU through an externally installed resistor RL, so the reset signal RST becomes high level (≈VPU).

When VIN>V21, the inner voltage generating portion 40 is activated, so the inner voltage Vreg starts rising toward a target value (e.g., 5 V). At this time point, the input voltage VIN has reached neither the reset release voltage (=Vref/α) nor the shield release voltage (=Vref/β), so both the comparison signals S1 and S2 become high level.

In addition, if the comparison signal S2 is at a high level, the inverted comparison signal S2B becomes low level, the switch portion 50 is turned on, and Vreg becomes equal to VIN. Thus, along with the rise in the input voltage VIN, the respective high levels (≈VIN) of the comparison signals S1 and S2 also gradually rise.

When VIN=V22, the input voltage VIN has reached the minimum operating voltage VL of the reference voltage generating portion 10 and the input voltage monitoring portion 30. Herein, in the voltage monitoring apparatus 1 of this embodiment, as discussed in the description above, at that time point, the switch portion 50 is turned on, and Vreg is equal to VIN. Thus, the input voltage VIN is inputted as the respective power voltages of the reference voltage generating portion 10 and the input voltage monitoring portion 30, and the reset signal RST may be lowered to a low level (referring to the solid line of RST) at that time point.

Assume that the switch portion 50 is not turned on, and the inner voltage Vreg lower than the input voltage VIN is inputted as the respective power voltages of the reference voltage generating portion 10 and the input voltage monitoring portion 30. When VIN=V23, only at the time point which the inner voltage Vreg has reached the minimum operating voltage VL of the reference voltage generating portion 10 and the input voltage monitoring portion 30, the reset signal RST may be lowered to a low level (referring to the dotted line of RST).

That is, with the switch portion 50 and the switch driving portion 60 introduced, in a low-input region (VIN<Vref/β), the switch portion 50 may be conducted to eliminate the difference between the input voltage VIN and the inner voltage Vreg, such that the minimum operating voltage of the voltage monitoring apparatus 1 may be lowered from the voltage value V23 to the voltage value V22.

Furthermore, if the input voltage VIN rises further, when VIN=V24, the input voltage VIN has reached the shield release voltage (=Vref/β). Thus, the comparison signal S2 lowers to a low level (≈GND), the inverted comparison signal S2B rises to a high level (≈VIN) after the comparison signal S2 at a low level is received, so the switch portion 50 is turned off. That is to say, the shield release voltage (=Vref/β) is equivalent to a threshold voltage for switching the switch portion 50 from being turned on to turned off. Furthermore, the shield release voltage (=Vref/β) is a voltage value (e.g., approximately 3 V) that is appropriately set by considering output characteristics of the voltage monitoring apparatus 1 (with associated details to be provided below).

When the switch portion 50 is turned off, Vreg is not equal to VIN. Thus, the inner voltage Vreg is inputted to the reference voltage generating portion 10, the input voltage monitoring portion 30 and the switch driving portion 60 as the respective power voltages thereof. For example, a high level of the comparison signal S1 switches from the input voltage VIN to the inner voltage Vreg.

Furthermore, if the input voltage VIN rises further, when VIN=V26, the comparison signal S1 lowers from a high level (≈Vreg) to a low level (≈GND). As a result, the reset signal RST rises from a low level (≈GND) to a high level (≈VPU).

On the other hand, if the input voltage VIN drops after the reset signal RST rises to a high level (≈VPU), when VIN=V25, the comparison signal S1 rises from a low level (≈GND) to a high level (≈Vreg). As a result, the reset signal RST lowers from a high level (≈VPU) to a low level (≈GND).

That is, the voltage values V25 and V26 are respectively equivalent to the reset detection voltage and the reset release voltages of the input voltage VIN, with a hysteresis voltage Vhys provided between the two. The normal operation of the voltage monitoring apparatus 1 is not different from that of the second comparison example (FIG. 3) in the description above.

As described previously, the switch driving portion 60 turns on the switch portion 50 if the input voltage VIN is lower than the shield release voltage (≈Vref/r), and on the other hand, turns off the switch portion 50 if the input voltage VIN is higher than the shield release voltage. That is, in a low-input region (VIN<Vref/β), the difference between the input voltage VIN and the inner voltage Vreg may be eliminated.

A set value of the shield release voltage (=Vref/β) is discussed below. First of all, the shield release voltage (=Vref/β) is preferably set as: turning off the switch portion 50 upon the inner voltage generating portion 40 changing to a state capable of outputting the inner voltage Vreg that is at least higher than the minimum operating voltage VL of the reference voltage generating portion 10 and the input voltage monitoring portion 30. According to such setting, the concern that the reference voltage generating portion 10 and the input voltage monitoring portion 30 may be restored to indefinite states if the switch portion 50 is turned off may be eliminated.

Furthermore, the shield release voltage (=Vref/β) is preferably set as: turning off the switch portion 50 before the input voltage VIN exceeds the respective withstand voltages of the reference voltage generating portion 10, the input voltage monitoring portion 30 and the switch driving portion 60. According to such setting, the concern of damage of internal circuits (the reference voltage generating portion 10, the input voltage monitoring portion 30 or the switch driving portion 60) formed by low voltage tolerant devices during a turned-on period (Vreg=VIN) of the switch portion 50 may be eliminated.

Furthermore, the shield release voltage (=Vref/β) is preferably set as: turning off the NMOSFET 52 before the input voltage VIN exceeds the gate-source withstand voltage of the PMOSFET 51. According to such setting, the concern of damage of the gate-source withstand voltage of the PMOSFET 51 during a turned-on period (S2B≈GND) of the switch portion 50 may be eliminated. In general, the gate-source withstand voltage (e.g., 7-V tolerant) of the PMOSFET 51 is not as high as the drain-source withstand voltage (e.g., 60-V tolerant), and hence such setting is extremely critical.

Furthermore, upon switching the switch portion 50 from being turned on to turned off, the gate-source voltage of the PMOSFET 51 becomes zero. Thus, even if the input voltage VIN rises, damage of gate-source withstand voltage of the PMOSFET 51 is not incurred.

Voltage Monitoring Apparatus (Second Embodiment)

Figure 6:
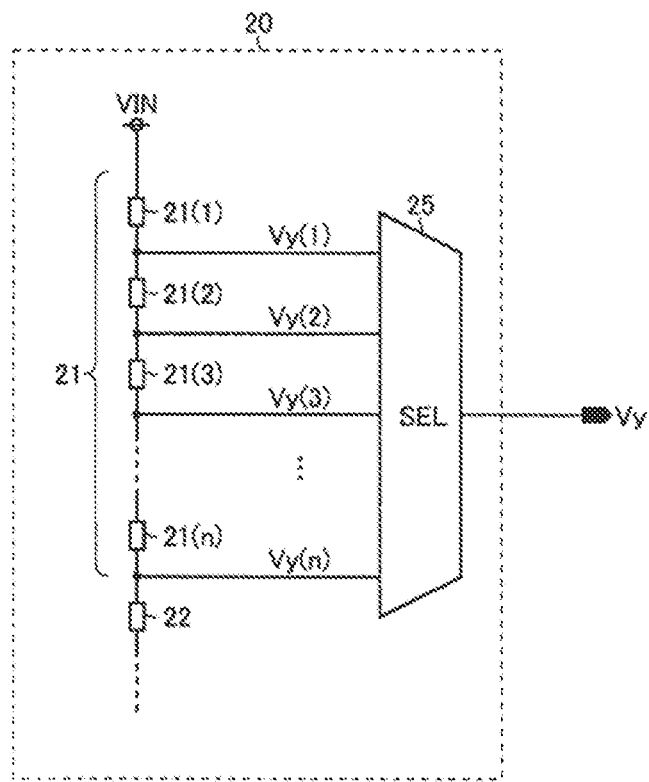
FIG. 6 is a diagram of a voltage monitoring apparatus according to a second embodiment.

FIG. 6 shows a diagram of a voltage monitoring apparatus according to a second embodiment. In this embodiment, the divided voltage generating portion 20 is configured as below, that is, including n resistors 21(1) to 21(n) as the resistor 21 described above, and a voltage selecting portion 25 selecting one of divided voltages Vy(1) to Vy(n) led out from connecting nodes between these resistors as the divided voltage Vy described above.

Furthermore, the voltage selecting portion 25 dynamically performs voltage selection according to a control signal inputted from the outside of the voltage monitoring apparatus 1, or a control signal read from a memory (not shown) of the voltage monitoring apparatus 1. Alternatively, a voltage selection state of the voltage selecting portion 25 may also be fixedly configured by trimming in a manufacturing phase of the voltage monitoring apparatus 1.

Using the configuration above, the voltage divider ratio β of the divided voltage Vy may be easily adjusted as desired. For example, when the withstand voltage of the NMOSFET 32 is changed, only the voltage divider ratio β (hence the shield release voltage Vref/β) of the divided voltage Vy needs to be correspondingly and appropriately adjusted.

Furthermore, in this embodiment, a mechanism for adjusting the voltage divider ratio β is given as an example. However, the same configuration may also be adopted with respect to a mechanism for adjusting the voltage divider ratio α.

Voltage Monitoring Apparatus (Third Embodiment)

Figure 7:
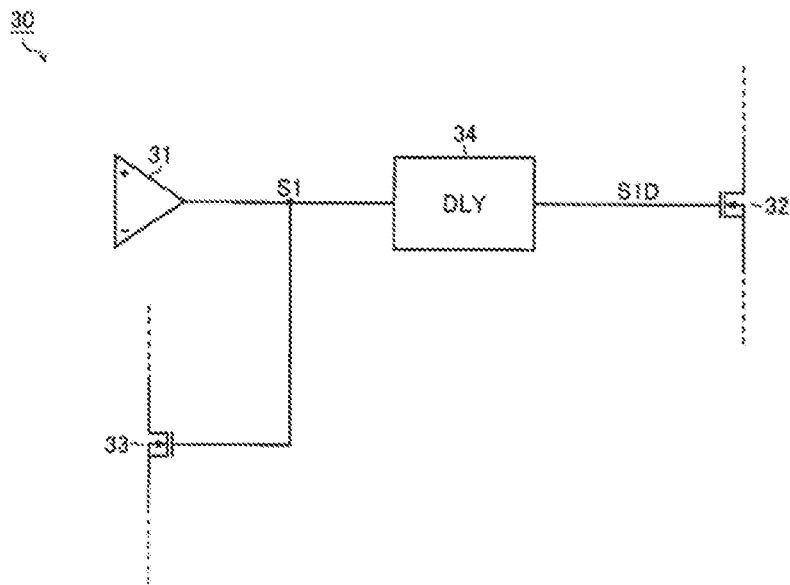
FIG. 7 is a diagram of a voltage monitoring apparatus according to a third embodiment.

FIG. 7 shows a diagram of a voltage monitoring apparatus according to a third embodiment. In this embodiment, the input voltage monitoring portion 30 further includes a delay portion 34 between the output terminal of the comparator 31 and the gate of the NMOSFET 32.

The delay portion 34 is a circuit block which provides the comparison signal S1 with a delay to generate a delayed comparison signal S1D and outputs the delayed comparison signal S1D to the gate of the NMOSFET 32, and may be implemented by a RC (resistance-capacitance) time-constant circuit or a fixed current circuit.

Figure 8:
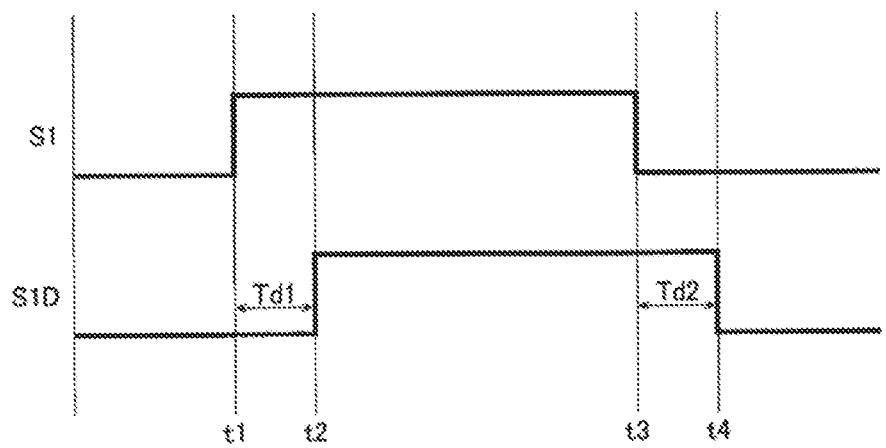
FIG. 8 is a diagram of an example of a delay operation.

FIG. 8 shows a diagram of an example of a delay operation of the delay portion 34. In an order from top to bottom, the comparison signal S1 and the delayed comparison signal S1D are depicted.

As shown in this drawing, the delayed comparison signal S1D becomes high level at a time point (=timing t2) after a delay time Td1 has elapsed since the comparison signal S1 rises to a high level at a timing t1. Furthermore, the delayed comparison signal S1D becomes low level at a time point (=timing t4) after a delay time Td2 has elapsed since the comparison signal S1 lowers to a low level at a timing t3.

As such, by introducing the delay portion 34, the pulse edge timing (hence the pulse edge timing of the reset signal RST) of the delayed comparison signal S1D may be adjusted as desired.

Other Variant Example

In addition to the embodiments described above, various modifications may be made to various technical features disclosed in the present disclosure without departing from the scope of the subject matter of the technical creation of the present disclosure. That is, it should be understood that all details of the embodiments are exemplary and are non-limiting. It should also be understood that the technical scope of the present invention is not limited by the embodiments described above, and should encompass all modifications of the meanings and scope equivalent to the appended claims.

INDUSTRIAL APPLICABILITY

The invention disclosed by the present disclosure may be applied to a voltage monitoring apparatus (e.g., a reset IC applied to vehicles) in need of monitoring a high input voltage.

What is claimed is:

1. A voltage monitoring apparatus, comprising:
   an inner voltage generating portion, lowering an input voltage to generate an inner voltage;
   an input voltage monitoring portion, receiving a power supply from an output terminal of the inner voltage generating portion to operate;
   a switch portion, disposed between an input terminal of the input voltage and the output terminal of the inner voltage generating portion; and
   a switch driving portion, turning on the switch portion when the input voltage is lower than a threshold voltage and turning off the switch portion when the input voltage is higher than the threshold voltage.

2. The voltage monitoring apparatus according to claim 1, wherein the threshold voltage is set as: turning off the switch portion upon the inner voltage generating portion changing to a state of being capable of outputting the inner voltage at least higher than a minimum operating voltage of the input voltage monitoring portion.

3. The voltage monitoring apparatus according to claim 1, wherein the threshold voltage is set as: turning off the switch portion before the input voltage exceeds a withstand voltage of the input voltage monitoring portion.

4. The voltage monitoring apparatus according to claim 2, wherein the threshold voltage is set as: turning off the switch portion before the input voltage exceeds a withstand voltage of the input voltage monitoring portion.

5. The voltage monitoring apparatus according to claim 1, wherein the switch portion comprises:
   a PMOSFET (p-channel metal-oxide-semiconductor field-effect transistor), comprising a source connected to the input terminal of the input voltage, and a drain connected to the output terminal of the inner voltage generating portion;
   an NMOSFET (n-channel metal-oxide-semiconductor field-effect transistor), comprising a drain connected to a gate of the PMOSFET, a source connected to a ground terminal, and a gate connected to the switch driving portion; and
   a current source, comprising a first terminal connected to the input terminal of the input voltage, and a second terminal connected to a gate of the PMOSFET.

6. The voltage monitoring apparatus according to claim 5, wherein the threshold voltage is set as: turning off the NMOSFET before the input voltage exceeds a gate-source withstand voltage of the PMOSFET.

7. The voltage monitoring apparatus according to claim 1, wherein the input voltage monitoring portion comprises:
   a first comparator, receiving the power supply from the output terminal of the inner voltage generating portion to operate, and comparing a first divided voltage corresponding to the input voltage with a predetermined reference voltage to generate a first comparison signal; and
   an output transistor, turning on/off according to the first comparison signal.

8. The voltage monitoring apparatus according to claim 7, wherein the input voltage monitoring portion further comprises:
   a delay portion, providing the first comparison signal with a delay.

9. The voltage monitoring apparatus according to claim 7, wherein the switch driving portion comprises:
   a second comparator, receiving the power supply from the output terminal of the inner voltage generating portion to operate, and comparing a second divided voltage corresponding to the input voltage with the reference voltage to generate a second comparison signal for driving the switch portion.

10. The voltage monitoring apparatus according to claim 8, wherein the switch driving portion comprises:
    a second comparator, receiving the power supply from the output terminal of the inner voltage generating portion to operate, and comparing a second divided voltage corresponding to the input voltage with the reference voltage to generate a second comparison signal for driving the switch portion.

11. The voltage monitoring apparatus according to claim 9, further comprising:
    a divided voltage generating portion, dividing the input voltage to generate the first divided voltage and the second divided voltage.

12. The voltage monitoring apparatus according to claim 11, wherein the divided voltage generating portion adjusts a voltage divider ratio of at least one of the first divided voltage and the second divided voltage.

* * * * *